(12) United States Patent
Steigerwald

(10) Patent No.: US 11,304,306 B2
(45) Date of Patent: Apr. 12, 2022

(54) VEHICULAR VISION SYSTEM CAMERA WITH COAXIAL CABLE CONNECTOR

(71) Applicant: MAGNA ELECTRONICS INC., Auburn Hills, MI (US)

(72) Inventor: Jens Steigerwald, Sailauf-Eichenberg (DE)

(73) Assignee: MAGNA ELECTRONICS INC., Auburn Hills, MI (US)

( * ) Notice: Subject to any disclaimer, the term of this patent is extended or adjusted under 35 U.S.C. 154(b) by 35 days.

(21) Appl. No.: 16/779,818

(22) Filed: Feb. 3, 2020

(65) Prior Publication Data
US 2020/0178397 A1 Jun. 4, 2020

Related U.S. Application Data

(60) Division of application No. 15/460,662, filed on Mar. 16, 2017, now Pat. No. 10,555,423, which is a
(Continued)

(51) Int. Cl.
*H01R 43/00* (2006.01)
*H05K 3/34* (2006.01)
(Continued)

(52) U.S. Cl.
CPC ............... *H05K 3/341* (2013.01); *B60R 1/04* (2013.01); *B60R 1/12* (2013.01); *B60R 16/023* (2013.01); *H01R 9/0515* (2013.01); *H01R 43/0256* (2013.01); *H04N 5/2252* (2013.01); *H04N 5/2253* (2013.01); *H04N 5/2254* (2013.01); *H04N 7/10* (2013.01); *H04N 7/181* (2013.01); *H05K 1/111* (2013.01); *H05K 1/181* (2013.01); *H05K 3/0008* (2013.01); *H05K 3/303* (2013.01); *B60R 2001/1253* (2013.01); *B60R 2300/105* (2013.01); *B60Y 2410/10* (2013.01); *B60Y 2410/115* (2013.01); *H05K 2201/10121* (2013.01); *H05K 2201/10151* (2013.01); *H05K 2201/10189* (2013.01);
(Continued)

(58) Field of Classification Search
CPC ... B60R 11/04; G02B 2027/0138; G02B 7/02; H04N 5/2257; Y10T 29/53174; Y10T 29/49124; H05K 2203/166; H05K 5/0069
USPC .......... 29/739, 729, 825, 828, 829, 834, 846
See application file for complete search history.

(56) References Cited

U.S. PATENT DOCUMENTS 5,550,677 A  8/1996 Schofield et al.
5,670,935 A  9/1997 Schofield et al.
(Continued)

*Primary Examiner* — Thiem D Phan
(74) *Attorney, Agent, or Firm* — Honigman LLP

(57) ABSTRACT

A method for assembling a camera suitable for use for a vision system of a vehicle includes providing a circuit board having first and second sides separated by a thickness dimension of the circuit board. An imager is disposed at the first side of the circuit board and solder pads are disposed at the second side of the circuit board. The solder pads are in electrical connection with circuitry of the circuit board. A coaxial connector is aligned at the solder pads at the second side of the circuit board. The coaxial connector is soldered at the second side of the circuit board via the solder pads. The solder pads may include a plurality of outer solder pads and at least one inner solder pad for connecting to respective contact portions of the coaxial connector.

8 Claims, 6 Drawing Sheets

Related U.S. Application Data continuation of application No. 14/303,696, filed on Jun. 13, 2014, now Pat. No. 9,609,757.

(60) Provisional application No. 61/838,621, filed on Jun. 24, 2013.

(51) Int. Cl.
| | |
|---|---|
| *H05K 3/00* | (2006.01) |
| *H05K 3/30* | (2006.01) |
| *B60R 1/04* | (2006.01) |
| *B60R 1/12* | (2006.01) |
| *B60R 16/023* | (2006.01) |
| *H01R 9/05* | (2006.01) |
| *H01R 43/02* | (2006.01) |
| *H04N 5/225* | (2006.01) |
| *H04N 7/10* | (2006.01) |
| *H04N 7/18* | (2006.01) |
| *H05K 1/11* | (2006.01) |
| *H05K 1/18* | (2006.01) |

(52) U.S. Cl.
CPC ........ *H05K 2203/166* (2013.01); *Y02P 70/50* (2015.11); *Y10T 29/49117* (2015.01); *Y10T 29/49124* (2015.01); *Y10T 29/53174* (2015.01)

(56) References Cited

U.S. PATENT DOCUMENTS

| | | |
|---|---|---|
| 5,949,331 A | 9/1999 | Schofield et al. |
| 6,690,268 B2 | 2/2004 | Schofield et al. |
| 6,757,109 B2 | 6/2004 | Bos |
| 7,965,336 B2 | 6/2011 | Bingle et al. |
| 8,503,061 B2 | 8/2013 | Uken et al. |
| 8,542,451 B2 | 9/2013 | Lu et al. |
| 8,740,629 B1 * | 6/2014 | Hall ................... H01R 13/6456 439/63 |
| 8,866,907 B2 | 10/2014 | McElroy et al. |
| 9,233,641 B2 | 1/2016 | Sesti et al. |
| 9,565,342 B2 | 2/2017 | Sauer et al. |
| 9,609,757 B2 | 3/2017 | Steigerwald |
| 10,555,423 B2 | 2/2020 | Steigerwald |
| 2009/0244361 A1 * | 10/2009 | Gebauer ............... H04N 5/2254 348/373 |
| 2013/0222595 A1 | 8/2013 | Gebauer et al. |
| 2013/0242099 A1 | 9/2013 | Sauer et al. |
| 2013/0328672 A1 | 12/2013 | Sesti et al. |
| 2013/0344736 A1 | 12/2013 | Latunski |
| 2014/0138140 A1 | 5/2014 | Sigle |
| 2014/0320636 A1 | 10/2014 | Bally et al. |
| 2014/0362209 A1 | 12/2014 | Ziegenspeck et al. |
| 2014/0373345 A1 | 12/2014 | Steigerwald |
| 2015/0222795 A1 | 8/2015 | Sauer et al. |
| 2015/0266430 A1 | 9/2015 | Mleczko et al. |
| 2015/0365569 A1 | 12/2015 | Mai et al. |
| 2016/0037028 A1 | 2/2016 | Biemer |

\* cited by examiner

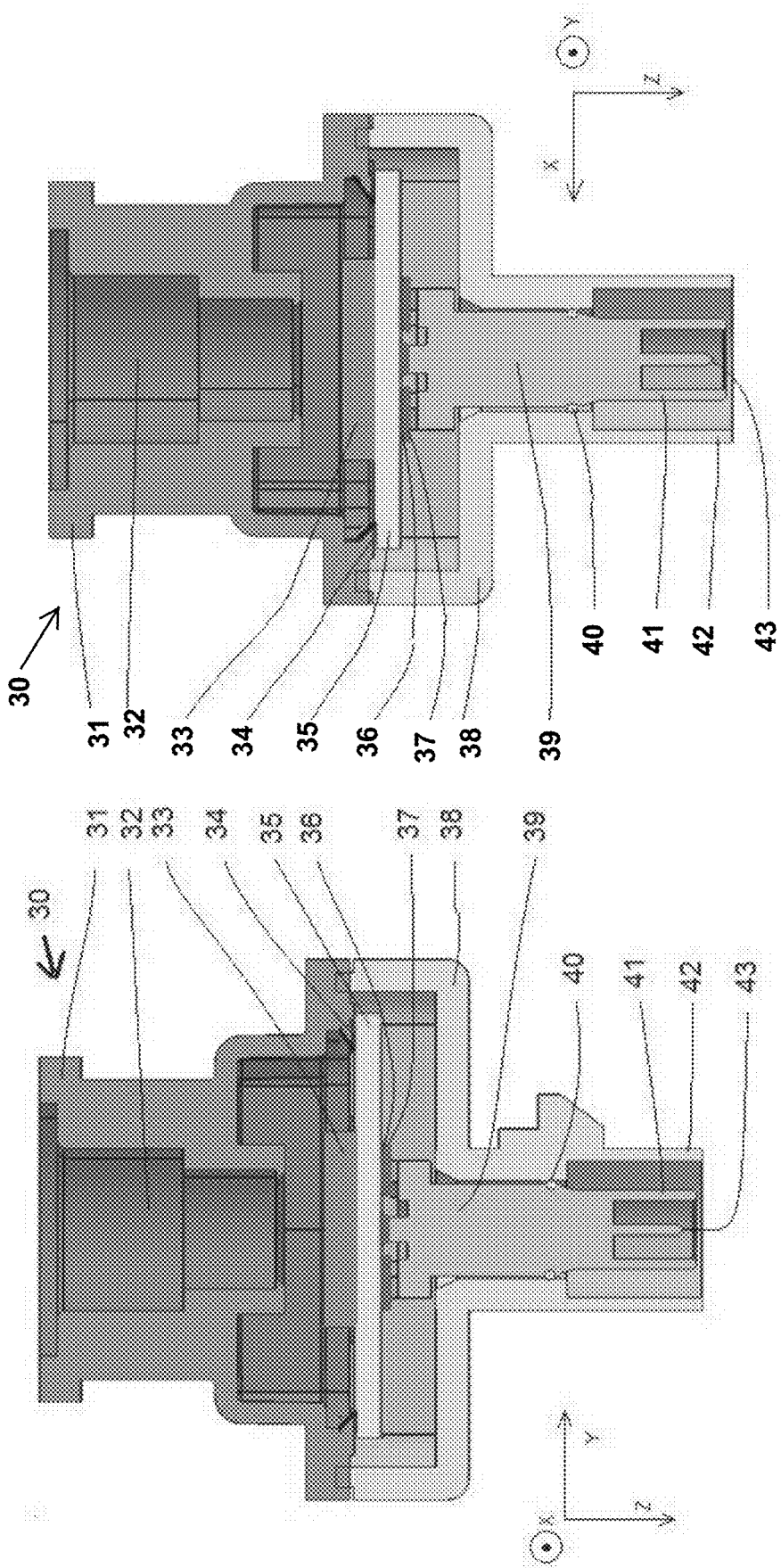

VEHICULAR VISION SYSTEM CAMERA WITH COAXIAL CABLE CONNECTOR

CROSS REFERENCE TO RELATED APPLICATIONS

The present application is divisional of U.S. patent application Ser. No. 15/460,662, filed Mar. 16, 2017, now U.S. Pat. No. 10,555,423, which is a continuation of U.S. patent application Ser. No. 14/303,696, filed Jun. 13, 2014, now U.S. Pat. No. 9,609,757, which claims the filing benefits of U.S. provisional application Ser. No. 61/838,621, filed Jun. 24, 2013, which is hereby incorporated herein by reference in its entirety.

FIELD OF THE INVENTION

The present invention relates generally to a vehicle vision system for a vehicle and, more particularly, to a vehicle vision system that utilizes one or more cameras at a vehicle.

BACKGROUND OF THE INVENTION

Use of imaging sensors in vehicle imaging systems is common and known. Examples of such known systems are described in U.S. Pat. Nos. 5,949,331; 5,670,935 and/or 5,550,677, which are hereby incorporated herein by reference in their entireties.

SUMMARY OF THE INVENTION

The present invention provides a collision avoidance system or vision system or imaging system for a vehicle that utilizes one or more cameras (preferably one or more CMOS cameras) to capture image data representative of images exterior of the vehicle, and provides a system or method of aligning and connecting a coaxial connector at circuitry of a printed circuit board of the camera so that the coaxial connector is attached at the circuitry and is aligned relative to a coordinate system of the circuit board and lens barrel. Thus, when the coaxial connector is substantially aligned and attached (such as via soldering) at the circuit board, the coaxial connector will be substantially aligned relative to a rear housing portion of the camera that is then attached at the lens barrel to substantially encase or house the circuit board and imager and at least a portion of the coaxial connector within the lens barrel and rear housing portion construction.

These and other objects, advantages, purposes and features of the present invention will become apparent upon review of the following specification in conjunction with the drawings.

BRIEF DESCRIPTION OF THE DRAWINGS

FIGS. 2A and 2B are sectional views of an assembled automotive mono PCB camera with coaxial connector structure in accordance with the present invention;

Figure 1:
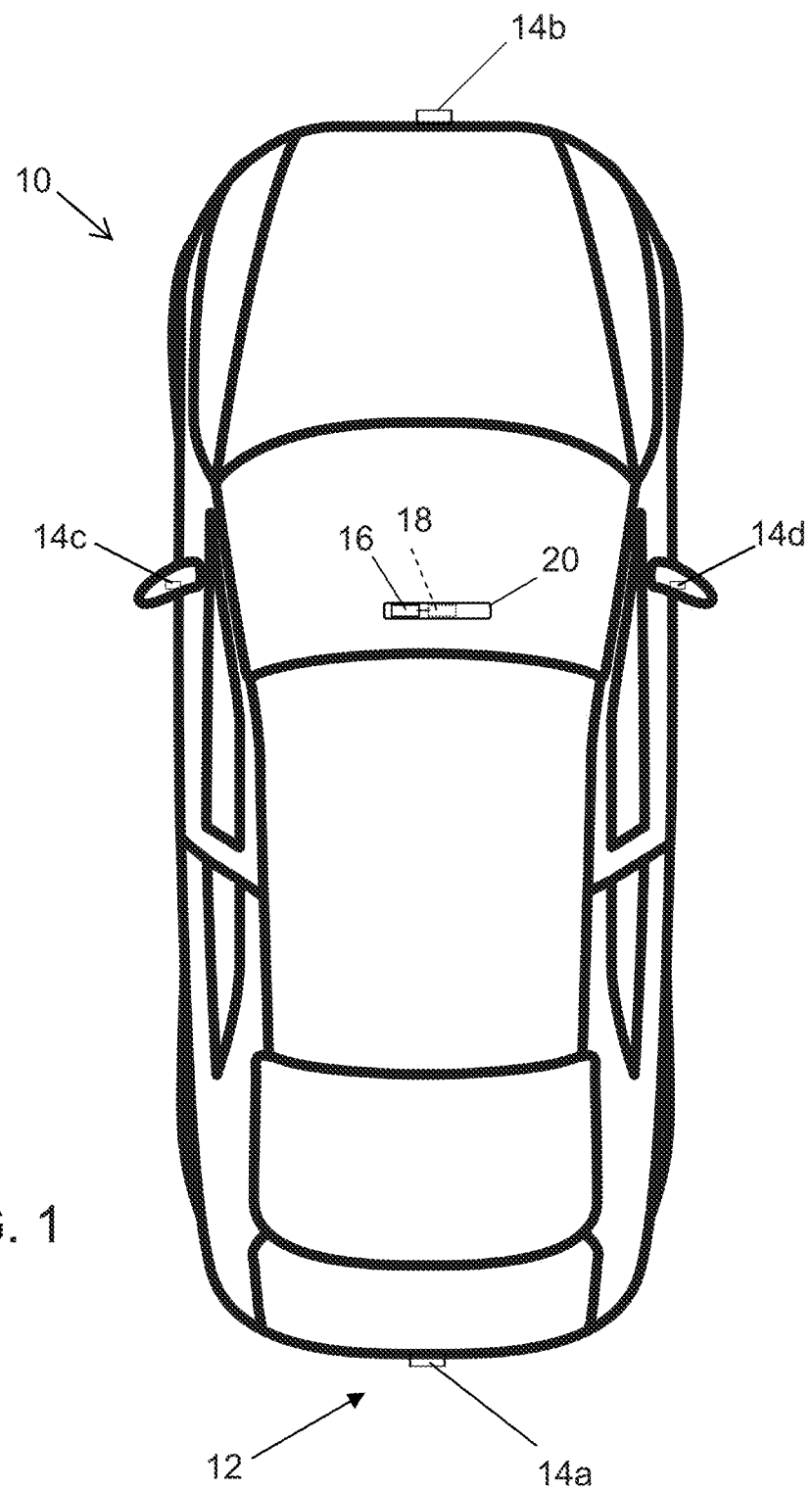
FIG. 1 is a plan view of a vehicle with a vision system that incorporates cameras in accordance with the present invention.
Figure 3B:
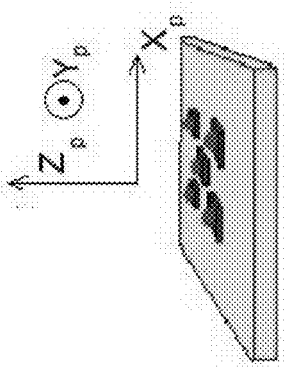
FIG. 3B is a perspective view of the circuit element or board of FIG. 3A, shown without the lens barrel structure.
Figure 3A:
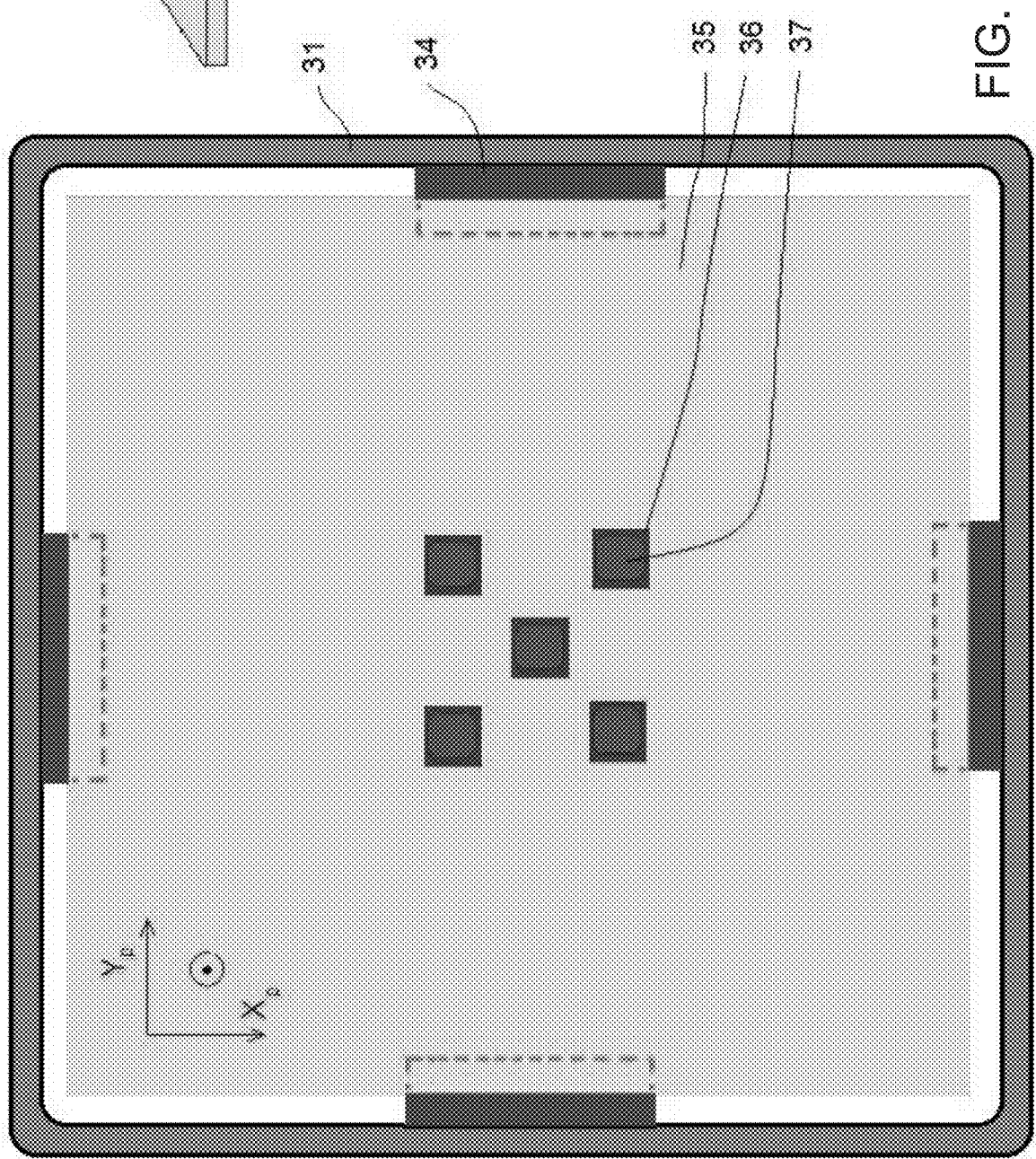
FIG. 3A is a plan view of a circuit element or circuit board or printed circuit board (PCB) of the camera of FIGS. 2A and 2B, shown as disposed at the lens barrel with the assembled imager circuit element or board and with the solder applied to the connector socket pads, and shown before the socket assembly.
Figure 4:
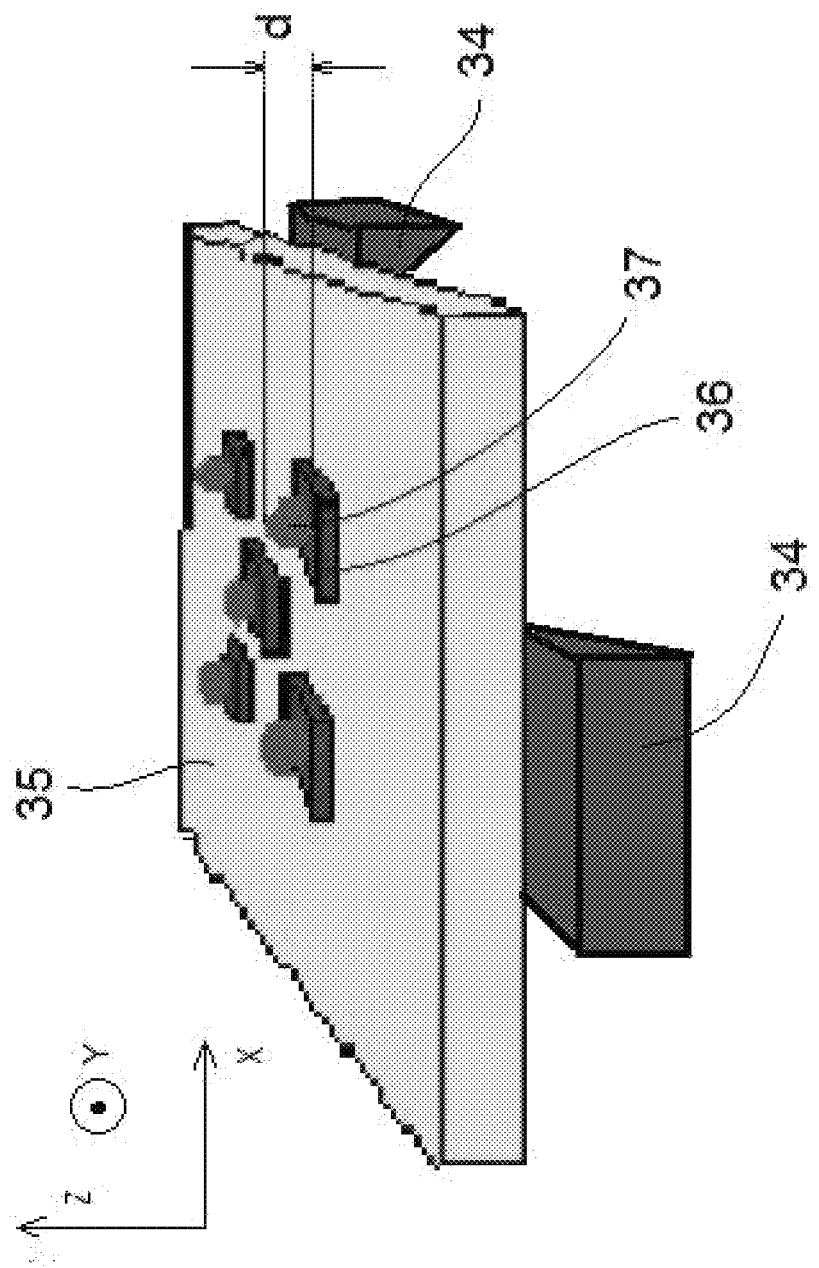
FIG. 4 is an enlarged perspective view of the circuit element of FIG. 3B, showing additionally the shoulders the PCB rests on in the lens barrel and the height dimension 'd' of the SMD solder paste.
Figure 5:
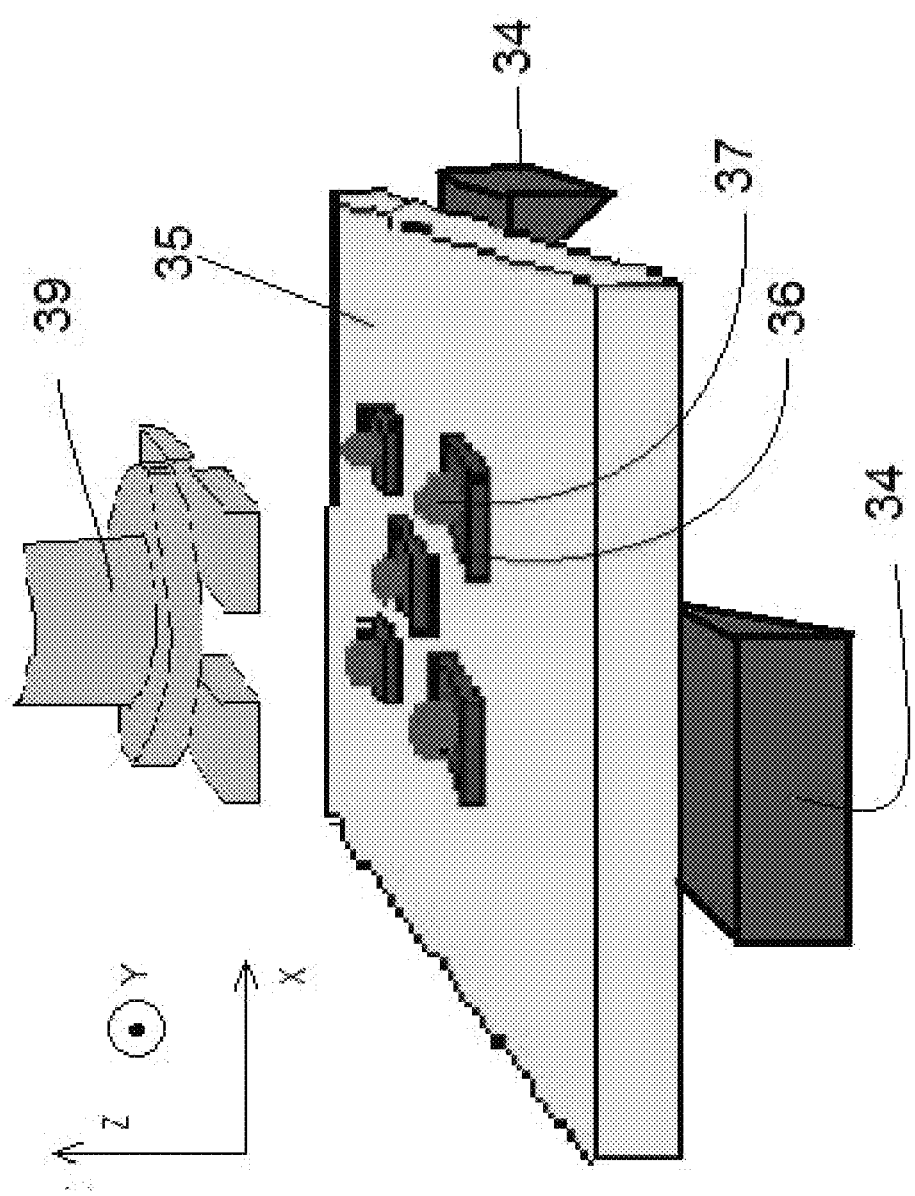
FIG. 5 is another perspective view of the circuit element of FIG. 4, with a coaxial connector socket spaced from the circuit element, showing the lower end of the coaxial connector socket closing to the circuit element or board or PCB (leaving out the robot grabber which is carrying the connector socket)
Figure 6:
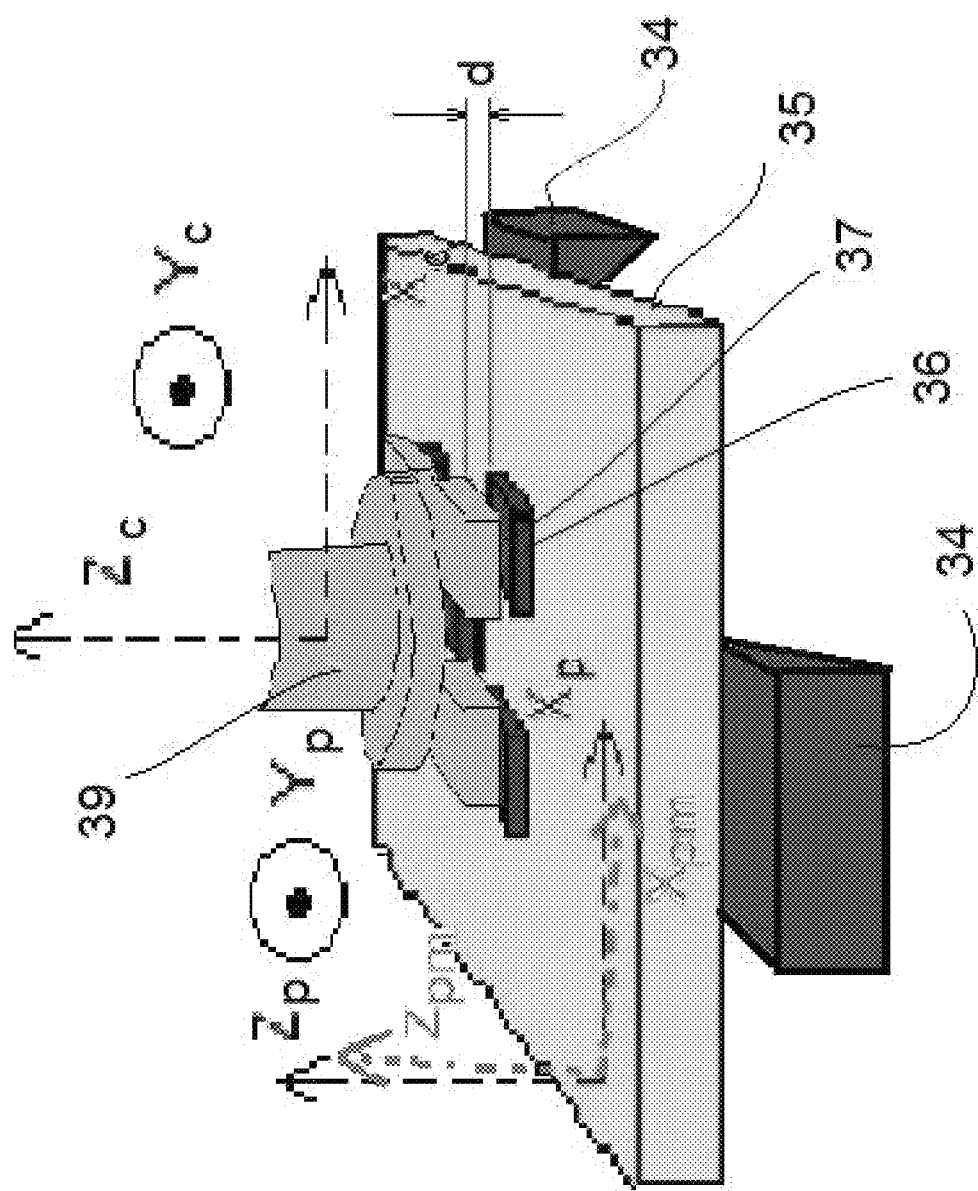
FIG. 6 is another perspective view of the circuit element of FIG. 5, showing the coaxial connector socket in an aligned position which may be above the PCB pads to fit the alignment, where the coordinate system c ($X_C Y_C Z_C$) may be the connector system which may be oriented different than the base system of the PCB p ($X_P Y_P Z_P$), and where the system pm ($X_{PM} Y_{PM} Z_{PM}$) may be the ideal non deviating PCB system with respect to the coordinate system c.

LEGEND
30 Automotive vision camera with single PCB
31 Lens barrel
32 Lens system area
33 Imager
34 Shoulder PCB is resting on
35 PCB
36 PCB pad
37 SMD solder paste
38 Camera bottom structure
39 coaxial connector socket
40 (optional) sealing O-ring
41 coaxial shield (as part of the socket)
42 outer connector structure (as part of the camera bottom structure)
43 coaxial core (as part of the socket)

DESCRIPTION OF THE PREFERRED EMBODIMENTS

A vehicle vision system and/or driver assist system and/or object detection system and/or alert system operates to capture images exterior of the vehicle and may process the captured image data to display images and to detect objects at or near the vehicle and in the predicted path of the vehicle, such as to assist a driver of the vehicle in maneuvering the vehicle in a rearward direction. The vision system includes an image processor or image processing system that is operable to receive image data from one or more cameras and provide an output to a display device for displaying images representative of the captured image data. Optionally, the vision system may provide a top down or bird's eye or surround view display and may provide a displayed image that is representative of the subject vehicle, and optionally with the displayed image being customized to at least partially correspond to the actual subject vehicle.

Referring now to the drawings and the illustrative embodiments depicted therein, a vehicle 10 includes an imaging system or vision system 12 that includes at least one exterior facing imaging sensor or camera, such as a rearward facing imaging sensor or camera 14a (and the system may optionally include multiple exterior facing imaging sensors or cameras, such as a forwardly facing camera 14b at the front (or at the windshield) of the vehicle, and a sidewardly/rearwardly facing camera 14c, 14d at respective sides of the vehicle), which captures images exterior of the vehicle, with the camera having a lens for focusing images at or onto an imaging array or imaging plane or imager of the camera (FIG. 1). The vision system 12 includes a control or electronic control unit (ECU) or processor 18 that is operable to process image data captured by the cameras and may provide displayed images at a display device 16 for viewing by the driver of the vehicle (although shown in FIG. 1 as being part of or incorporated in or at an interior rearview mirror assembly 20 of the vehicle, the control and/or the display device may be disposed elsewhere at or in the vehicle). The data transfer or signal communication from the camera to the ECU may comprise any suitable data or communication link, such as a vehicle network bus or the like of the equipped vehicle.

U.S. patent application, Ser. No. 13/785,099, filed on Mar. 5, 2013 and published Sep. 19, 2013 as U.S. Publication No. US-2013-0242099, which is hereby incorporated herein by reference in its entirety, describes the assembly of an automotive vision system camera connector to a camera housing having a flexible area for (passively) compensating/mechanically adjusting misalignments between the connector structure and the housing for preventing high insertion forces when connecting with camera connectors due to misalignment. The present invention, instead of applying a mechanically elastically/flexible area at the connector or its socket, may mount the socket in a precise manner which is capable to cope with or accommodate the imprecision of the components and their mounting/assembly processes.

Referring to FIGS. 2A and 2B, an automotive vision camera 30 comprises a lens system disposed in or packed into a lens barrel 31 in the area 32. Behind the lens system there is typically an imaging array sensor or imager 33 with or without a filter/filters, such as the likes of an infrared (IR) filter (not shown) or the like. The imaging array sensor or imager 33 is typically SMD (surface-mounted device) mounted on a single printed circuit board (PCB) 35 of the camera. The mounting process is typically reflow soldering to mount or connect the imager and/or other circuitry at the PCB. At the time of the reflow or later, a connector socket may be applied to the PCB.

In some camera applications, one or more additional PCBs may carry the connector instead of the identical PCB the imager is mounted at. Typically, the imager-lens system aligning is crucial to the image quality the camera is producing. Typically, at the time the imager PCB is mated with the lens barrel, the aligning is done very carefully and precisely. Typically, the alignment is under steady control during the laser soldering or gluing. All later applications and installing processes are meant to not disturb this alignment. Applying any force to the PCB may cause a deviation of the former alignment. These forces may be applied due to bending of the lens holder system or by applying a force to the imager PCB. This may happen by insertion forces when connecting a connector to the connector socket which is fixed on the imager PCB. This may also happen by applying a mismatched camera bottom structure 38 or by assembling a true in size bottom structure at a (slightly) wrong position or angle.

The present invention provides an enhanced connection means for connecting a socket connector 39 of a coaxial cable at a single PCB 35 of the camera 30 (where the single PCB commonly mounts the imager 33 and the coaxial cable connector 39). As shown in FIGS. 3A-6, the PCB 35 may have a plurality of PCB pads 36 with solder paste 37 or the like disposed thereat. The connector 39 is aligned with and moved into engagement with the solder paste at the PCB pads, whereby the solder paste is heated and the connector is engaged with the heated solder paste and then the solder paste is cooled or cured to attach the connector at the PCB pads of the PCB. In the illustrated embodiment, the connector has four outer contacts and one central contact, which align with and connect to corresponding PCB pads disposed at the PCB.

By measuring the alignment of the PCB to the lens barrel structure 31 and by measuring the lower edge of the lens barrels contour, the system of the present invention sets a reference system (such as a reference coordinate system). The (inner) connector socket may be assembled to the PCB in a precise way having a distance and orientation so that it smoothly fits into the connector hole that it is inserted into or received into when the bottom structure is installed at the lens barrel. The bottom structure's dimensional production deviation may be reflected to fit the connector socket into the right position and orientation as well. For attaching the connector socket precisely, it may be held by a very precise appliance, such as, for example, a robot arm with a grabber above the surface of the PCB's (metallic) pads, which are coated with SMD solder from an earlier step or process.

The distance to the PCB may be close enough that the contact feeds of the socket may be moistened by the SMD solder. The solder may have a paste like consistency and each spot on the PCB pad may have a substantial height dimension (d), such as, for example, about 1 mm or greater, such as, for example, about 1.2 mm or thereabouts. The height dimension of the solder paste or drops or pads is the distance each connector feed can have from the PCB.

By tilting the socket, the distance of each foot of the socket connector to the PCB (which is not tilted) changes. Due to the connector foot optionally being smaller than the PCB pads, there is lateral clearance in two dimensions to shift (or turn) the connector socket across the PCB without contacting or conducting to neighboring circuit structures or losing contact to the designated PCB pads. The tilting and shifting may be done by the robot under constant control of the distance and angle against the base coordinate system (of the PCB).

The measuring may be done contactless, such as, for example, by a laser system or by a mechanically touching system, such as, for example, a Hall sensor/resolver based spindle drive or the like. The measuring system may comprise a control. At the time the measuring system's control determines that the desired position and orientation of the connector socket to the PCB is achieved or set, the soldering sequence may begin. The soldering may be done by a powerful laser pointing to the solder, a hollow needle which becomes extracted to the near of the PCB pads solder paste blowing hot air, reflow, by heating the connector socket itself (contact heating, conductive (shortcut) heating or inductive heating) or any other soldering process. Alternatively, the process may use any kind of conducting glue as like Carbon Bond® or a welding or the like. After the soldering process, the connector socket is connected at the PCB at the proper orientation and alignment.

After that, the rear housing 38 may be assembled to the lens barrel structure 31. The outer connector structure 42 should align to the (inner) structure comprised by the (PCB-) socket 39 at that time. In applications that use generally round shape coaxial connectors, the core 43 and the metal shield 41 should sit in the center of the round shape connector structure 42, which may be configured in a shape as like a Fakra connector or other coaxial connector structure, preferably an automotive type of connector structure.

Preferably, the connector comprises an inner contact and shielding structure, which may typically comprise metal, and an outer fixation structure, which may typically comprise plastic, with the metal and plastic structures mated together.

Thus, the present invention provides an enhanced connection process for aligning and connecting the coaxial connector 39 at the circuitry of the PCB 35. The connection process provides alignment and proper orientation of the connector 39 at the PCB 35 and attaches or solders the connector at the PCB when the proper alignment and orientation is achieved.

The coaxial connector may comprise any suitable coaxial connector. Optionally, and desirably, the coaxial connector comprises a connector that utilizes aspects of the connectors described in U.S. patent application Ser. No. 14/297,663, filed Jun. 6, 2014 and published Dec. 11, 2014 as U.S. Publication No. US-2014-0362209, which is hereby incorporated herein by reference in its entirety. As described in the 14/297,663 application, the coaxial cable carries signals for image data, control data and power. By transferring control data via at least one analog signal especially via modulation to a (sinusoidal) carrier wave, which has a frequency that is off or outside of the bandwidth of and with sufficient Shannon distance (or Nyquist distance) from the frequency of the image data signal (FBAS, YpbPr, YCbCr or other analog or digital image data format/encryption/modulation) (and decoupling/demodulating/filtering both signals at the other end of the data line), the present invention may transfer all data over just one coaxial line (cable) and may eliminate the need of LIN or CAN transceivers. The side bands of a carrier signal due to the signal modulation (the widths of the data bandwidths) must have a suitable distance to be filtered from one another. Otherwise, the Shannon-Nyquist criteria is infringed or in other words the (minimal) Shannon-Nyquist distance wasn't reflected when choosing the carriers. A greater distance is preferred when using relatively simple filters. Because the coaxial cable 'Ether' is generally empty beside the camera control signals and image data signals and power signals, the system of the present invention can use large distances between the frequencies, so long as the system has the carrier base waves generated for such signals and distances.

The suggested manner of transmitting data via a single coaxial line is essentially the use of analog signal waves having analog or digital data modulated onto it instead of carrying the bits directly in serial through the coaxial line. Due to the physics, resistive, capacitive or inductive disturbances do not change the frequency of signal waves (only active components can do that). By that, analog signals are much more robust and advanced compared to digital. The signal to noise ratio is better than when using LVDS signals as consecutive bits sent via a coaxial cable, by that the carrier signal amplitudes can be kept lower. By that the potential emitted disturbance will be less. Additionally, the disturbance band can be chosen not by accident but by choosing the carrier frequencies. By that, critical wave bands can be left out (for example, ultra short wave radio (disturbing the station finding of the car radio) or the like).

The carrier frequency must always be more than two times higher than the data frequency modulated to it (Shannon-Nyquist criteria). When using more than one carrier wave, more than one bit can be transmitted at a time (one each at each carrier). When using higher sophisticated modulation (such as QUAM), multiple bits can be modulated at one carrier instantaneously. This doubles when using two QUAM modulated at one carrier. When the parrallelity of the bit stream rises, the carrier frequencies can be chosen lower (which comes with less bandwidths).

DC has the frequency zero and by that DC is easy to split from data carriers by using a low pass filter. The filter setup is comparable to LVDS communications when supplying DC via a coax shared with data carriers.

Optionally, and as discussed in U.S. patent application Ser. No. 14/297,663, incorporated above, the camera may be supplied by AC power. Its frequency can be seen as any of the carriers, but with a very low frequency such as 60 Hz (for example, up to $10^5$ times lower). AC can be used well for voltage transformation. The power outlet can have several voltage poles without much active components. The space demand and heat generation is advanced compared of having a DC voltage decoupling coil, voltage converters and a transceiver.

The camera or sensor may comprise any suitable camera or sensor. Optionally, the camera may comprise a "smart camera" that includes the imaging sensor array and associated circuitry and image processing circuitry and electrical connectors and the like as part of a camera module, such as by utilizing aspects of the vision systems described in International Publication Nos. WO 2013/081984 and/or WO 2013/081985, which are hereby incorporated herein by reference in their entireties.

The system includes an image processor operable to process image data captured by the camera or cameras, such as for detecting objects or other vehicles or pedestrians or the like in the field of view of one or more of the cameras. For example, the image processor may comprise an EYEQ2 or EYEQ3 image processing chip available from Mobileye Vision Technologies Ltd. of Jerusalem, Israel, and may include object detection software (such as the types described in U.S. Pat. Nos. 7,855,755; 7,720,580 and/or 7,038,577, which are hereby incorporated herein by reference in their entireties), and may analyze image data to detect vehicles and/or other objects. Responsive to such image processing, and when an object or other vehicle is detected, the system may generate an alert to the driver of the vehicle and/or may generate an overlay at the displayed image to highlight or enhance display of the detected object or vehicle, in order to enhance the driver's awareness of the detected object or vehicle or hazardous condition during a driving maneuver of the equipped vehicle.

The vehicle may include any type of sensor or sensors, such as imaging sensors or radar sensors or lidar sensors or ladar sensors or ultrasonic sensors or the like. The imaging sensor or camera may capture image data for image processing and may comprise any suitable camera or sensing device, such as, for example, a two dimensional array of a plurality of photosensor elements arranged in at least 640 columns and 480 rows (at least a 640×480 imaging array, such as a megapixel imaging array or the like), with a respective lens focusing images onto respective portions of the array. The photosensor array may comprise a plurality of photosensor elements arranged in a photosensor array having rows and columns. Preferably, the imaging array has at least 300,000 photosensor elements or pixels, more preferably at least 500,000 photosensor elements or pixels and more preferably at least 1 million photosensor elements or pixels. The imaging array may capture color image data, such as via spectral filtering at the array, such as via an RGB (red, green and blue) filter or via a red/red complement filter or such as via an RCC (red, clear, clear) filter or the like. The logic and control circuit of the imaging sensor may function in any known manner, and the image processing and algorithmic processing may comprise any suitable means for processing the images and/or image data.

For example, the vision system and/or processing and/or camera and/or circuitry may utilize aspects described in U.S. Pat. Nos. 7,005,974; 5,760,962; 5,877,897; 5,796,094; 5,949,331; 6,222,447; 6,302,545; 6,396,397; 6,498,620; 6,523,964; 6,611,202; 6,201,642; 6,690,268; 6,717,610; 6,757,109; 6,802,617; 6,806,452; 6,822,563; 6,891,563; 6,946,978; 7,859,565; 5,550,677; 5,670,935; 6,636,258; 7,145,519; 7,161,616; 7,230,640; 7,248,283; 7,295,229; 7,301,466; 7,592,928; 7,881,496; 7,720,580; 7,038,577; 6,882,287; 5,929,786 and/or 5,786,772, and/or International Publication Nos. WO 2011/028686; WO 2010/099416; WO 2012/061567; WO 2012/068331; WO 2012/075250; WO 2012/103193; WO 2012/0116043; WO 2012/0145313; WO 2012/0145501; WO 2012/145818; WO 2012/145822; WO 2012/158167; WO 2012/075250; WO 2012/0116043; WO 2012/0145501; WO 2012/154919; WO 2013/019707; WO 2013/016409; WO 2013/019795; WO 2013/067083; WO 2013/070539; WO 2013/043661; WO 2013/048994; WO 2013/063014, WO 2013/081984; WO 2013/081985; WO 2013/074604; WO 2013/086249; WO 2013/103548; WO 2013/109869; WO 2013/123161; WO 2013/126715; WO 2013/043661 and/or WO 2013/158592, and/or U.S. patent applications, Ser. No. 14/359,341, filed May 20, 2014 and published Nov. 20, 2014 as U.S. Publication No. US-2014-0340510; Ser. No. 14/359,340, filed May 20, 2014 and published Oct. 23, 2014 as U.S. Publication No. US-2014-0313339; Ser. No. 14/282,029, filed May 20, 2014, now U.S. Pat. No. 9,205,776; Ser. No. 14/282,028, filed May 20, 2014 and published Nov. 27, 2014 as U.S. Publication No. US-2014-0347486; Ser. No. 14/358,232, filed May 15, 2014, now U.S. Pat. No. 9,491,451; Ser. No. 14/272,834, filed May 8, 2014, now U.S. Pat. No. 9,280,202; Ser. No. 14/356,330, filed May 5, 2014 and published Oct. 16, 2014 as U.S. Publication No. US-2014-0307095; Ser. No. 14/269,788, filed May 5, 2014 and published Nov. 6, 2014 as U.S. Publication No. US-2014-0327774; Ser. No. 14/268,169, filed May 2, 2014 and published Nov. 6, 2014 as U.S. Publication No. US-2014-0327772; Ser. No. 14/264,443, filed Apr. 29, 2014 and published Oct. 30, 2014 as U.S. Publication No. US-2014-0320636; Ser. No. 14/354,675, filed Apr. 28, 2014 and published Oct. 2, 2014 as U.S. Publication No. US-2014-0293057; Ser. No. 14/248,602, filed Apr. 9, 2014, now U.S. Pat. No. 9,327,693; Ser. No. 14/242,038, filed Apr. 1, 2014, now U.S. Pat. No. 9,487,159; Ser. No. 14/229,061, filed Mar. 28, 2014 and published Oct. 2, 2014 as U.S. Publication No. US-2014-0293042; Ser. No. 14/343,937, filed Mar. 10, 2014 and published Aug. 21, 2014 as U.S. Publication No. US-2014-0232872; Ser. No. 14/343,936, filed Mar. 10, 2014 and published Aug. 7, 2014 as U.S. Publication No. US-2014-0218535; Ser. No. 14/195,135, filed Mar. 3, 2014 and published Sep. 4, 2014 as U.S. Publication No. US-2014-0247354; Ser. No. 14/195,136, filed Mar. 3, 2014 and published Sep. 4, 2014 as U.S. Publication No. US-2014-0247355; Ser. No. 14/191,512, filed Feb. 27, 2014 and published Sep. 4, 2014 as U.S. Publication No. US-2014-0247352; Ser. No. 14/183,613, filed Feb. 19, 2014, now U.S. Pat. No. 9,445,057; Ser. No. 14/169,329, filed Jan. 31, 2014 and published Aug. 7, 2014 as U.S. Publication No. US-2014-0218529; Ser. No. 14/169,328, filed Jan. 31, 2014, now U.S. Pat. No. 9,092,986; Ser. No. 14/163,325, filed Jan. 24, 2014 and published Jul. 31, 2014 as U.S. Publication No. US-2014-0211009; Ser. No. 14/159,772, filed Jan. 21, 2014, now U.S. Pat. No. 9,068,390; Ser. No. 14/107,624, filed Dec. 16, 2013, now U.S. Pat. No. 9,140,789; Ser. No. 14/102,981, filed Dec. 11, 2013 and published Jun. 12, 2014 as U.S. Publication No. US-2014-0160276; Ser. No. 14/102,980, filed Dec. 11, 2013 and published Jun. 19, 2014 as U.S. Publication No. US-2014-0168437; Ser. No. 14/098,817, filed Dec. 6, 2013 and published Jun. 19, 2014 as U.S. Publication No. US-2014-0168415; Ser. No. 14/097,581, filed Dec. 5, 2013 and published Jun. 12, 2014 as U.S. Publication No. US-2014-0160291; Ser. No. 14/093,981, filed Dec. 2, 2013, now U.S. Pat. No. 8,917,169; Ser. No. 14/093,980, filed Dec. 2, 2013 and published Jun. 5, 2014 as U.S. Publication No. US-2014-0152825; Ser. No. 14/082,573, filed Nov. 18, 2013 and published May 22, 2014 as U.S. Publication No. US-2014-0139676; Ser. No. 14/082,574, filed Nov. 18, 2013, now U.S. Pat. No. 9,307,640; Ser. No. 14/082,575, filed Nov. 18, 2013, now U.S. Pat. No. 9,090,234; Ser. No. 14/082,577, filed Nov. 18, 2013, now U.S. Pat. No. 8,818,042; Ser. No. 14/071,086, filed Nov. 4, 2013, now U.S. Pat. No. 8,886,401; Ser. No. 14/076,524, filed Nov. 11, 2013, now U.S. Pat. No. 9,077,962; Ser. No. 14/052,945, filed Oct. 14, 2013 and published Apr. 17, 2014 as U.S. Publication No. US-2014-0104426; Ser. No. 14/046,174, filed Oct. 4, 2013 and published Apr. 10, 2014 as U.S. Publication No. US-2014-0098229; Ser. No. 14/016,790, filed Oct. 3, 2013 and published Mar. 6, 2014 as U.S. Publication No. US-2014-0067206; Ser. No. 14/036,723, filed Sep. 25, 2013 and published Mar. 27, 2014 as U.S. Publication No. US-2014-0085472; Ser. No. 14/016,790, filed Sep. 3, 2013 and published Mar. 6, 2014 as U.S. Publication No. US-2014-0067206; Ser. No. 14/001,272, filed Aug. 23, 2013, now U.S. Pat. No. 9,233,641; Ser. No. 13/970,868, filed Aug. 20, 2013 and published Feb. 20, 2014 as U.S. Publication No. US-2014-0049646; Ser. No. 13/964,134, filed Aug. 12, 2013 and published Feb. 20, 2014 as U.S. Publication No. US-2014-0052340; Ser. No. 13/942,758, filed Jul. 16, 2013 and published Jan. 23, 2014 as U.S. Publication No. US-2014-0025240; Ser. No. 13/942,753, filed Jul. 16, 2013 and published Jan. 30, 2014 as U.S. Publication No. US-2014-0028852; Ser. No. 13/927,680, filed Jun. 26, 2013 and published Jan. 2, 2014 as U.S. Publication No. US-2014-0005907; Ser. No. 13/916,051, filed Jun. 12, 2013, now U.S. Pat. No. 9,077,098; Ser. No. 13/894,870, filed May 15, 2013 and published Nov. 28, 2013 as U.S. Publication No. US-2013-0314503; Ser. No. 13/887,724, filed May 6, 2013 and published Nov. 14, 2013 as U.S. Publication No. US-2013-0298866; Ser. No. 13/852,190, filed Mar. 28, 2013 and published Aug. 29, 2013 as U.S. Publication No. US-2013-0222593; Ser. No. 13/851,378, filed Mar. 27, 2013, now U.S. Pat. No. 9,319,637; Ser. No. 13/848,796, filed Mar. 22, 2012 and published Oct. 24, 2013 as U.S. Publication No. US-2013-0278769; Ser. No. 13/847,815, filed Mar. 20, 2013 and published Oct. 31, 2013 as U.S. Publication No. US-2013-0286193; Ser. No. 13/800,697, filed Mar. 13, 2013 and published Oct. 3, 2013 as U.S. Publication No. US-2013-0258077; Ser. No. 13/785,099, filed Mar. 5, 2013 and published Sep. 19, 2013 as U.S. Publication No. US-2013-0242099; Ser. No. 13/779,881, filed Feb. 28, 2013, now U.S. Pat. No. 8,694,224; Ser. No. 13/774,317, filed Feb. 22, 2013, now U.S. Pat. No. 9,269,263; Ser. No. 13/774,315, filed Feb. 22, 2013 and published Aug. 22, 2013 as U.S. Publication No. US-2013-0215271; Ser. No. 13/681,963, filed Nov. 20, 2012, now U.S. Pat. No. 9,264,673; Ser. No. 13/660,306, filed Oct. 25, 2012, now U.S. Pat. No. 9,146,989; Ser. No. 13/653,577, filed Oct. 17, 2012, now U.S. Pat. No. 9,174,574; and/or Ser. No. 13/534,657, filed Jun. 27, 2012 and published Jan. 3, 2013 as U.S. Publication No. US-2013-0002873, and/or U.S. provisional applications, Ser. No. 62/001,796, filed May 22, 2014; Ser. No. 62/001,796, filed May 22, 2014; Ser. No. 61/993,736, filed May 15, 2014; Ser. 61/991,810, filed May 12, 2014;

Ser. No. 61/991,809, filed May 12, 2014; Ser. No. 61/990,927, filed May 9, 2014; Ser. No. 61/989,652, filed May 7, 2014; Ser. No. 61/981,938, filed Apr. 21, 2014; Ser. No. 61/981,937, filed Apr. 21, 2014; Ser. No. 61/977,941, filed Apr. 10, 2014; Ser. No. 61/977,940. filed Apr. 10, 2014; Ser. No. 61/977,929, filed Apr. 10, 2014; Ser. No. 61/977,928, filed Apr. 10,2014; Ser. No. 61/973,922, filed Apr. 2, 2014; Ser. No. 61/972,708, filed Mar. 31, 2014; Ser. No. 61/972,707, filed Mar. 31, 2014; Ser. No. 61/969,474, filed Mar. 24, 2014; Ser. No. 61/955,831, filed Mar. 20, 2014; Ser. No. 61/953,970, filed Mar. 17, 2014; Ser. No. 61/952,335, filed Mar. 13, 2014; Ser. No. 61/952,334, filed Mar. 13, 2014; Ser. No. 61/950,261, filed Mar. 10, 2014; Ser. No. 61/950,261, filed Mar. 10, 2014; Ser. No. 61/947,638, filed Mar. 4, 2014; Ser. No. 61/947,053, filed Mar. 3, 2014; Ser. No. 61/941,568, filed Feb. 19, 2014; Ser. No. 61/935,485, filed Feb. 4, 2014; Ser. No. 61/935,057, filed Feb. 3, 2014; Ser. No. 61/935,056, filed Feb. 3, 2014; Ser. No. 61/935,055, filed Feb. 3, 2014; Ser. 61/931,811, filed Jan. 27, 2014; Ser. No. 61/919,129, filed Dec. 20, 2013; Ser. No. 61/919,130, filed Dec. 20, 2013; Ser. No. 61/919,131, filed Dec. 20, 2013; Ser. No. 61/919,147, filed Dec. 20, 2013; Ser. No. 61/919,138, filed Dec. 20, 2013, Ser. No. 61/919,133, filed Dec. 20, 2013; Ser. No. 61/918,290, filed Dec. 19, 2013; Ser. No. 61/915,218, filed Dec. 12, 2013; Ser. No. 61/912,146, filed Dec. 5, 2013; Ser. No. 61/911, 666, filed Dec. 4, 2013; Ser. No. 61/911,665, filed Dec. 4, 2013; Ser. No. 61/905,461, filed Nov. 18, 2013; Ser. No. 61/905,462, filed Nov. 18, 2013; Ser. No. 61/901,127, filed Nov. 7, 2013; Ser. No. 61/895,610, filed Oct. 25, 2013; Ser. No. 61/895,609, filed Oct. 25, 2013; Ser. No. 61/879,837, filed Sep. 19, 2013; Ser. No. 61/879,835, filed Sep. 19, 2013; Ser. No. 61/875,351, filed Sep. 9, 2013; Ser. No. 61/869,195, filed. Aug. 23, 2013; Ser. No. 61/864,835, filed Aug. 12, 2013; Ser. No. 61/864, 836, filed Aug. 12, 2013; Ser. No. 61/864,837, filed Aug. 12, 2013; Ser. No. 61/864,838, filed Aug. 12, 2013; Ser. No. 61/856,843, filed Jul. 22, 2013; Ser. No. 61/845,061, filed Jul. 11, 2013; Ser. No. 61/844,630, filed Jul. 10, 2013; Ser. No. 61/844,173, filed Jul. 9, 2013; Ser. No. 61/844,171, filed Jul. 9, 2013; Ser. No. 61/842,644, filed Jul. 3, 2013; Ser. No. 61/840,542, filed Jun. 28, 2013; Ser. No. 61/838,619, filed Jun. 24, 2013; Ser. No. 61/837,955, filed Jun. 21, 2013; Ser. No. 61/836,900, filed Jun. 19, 2013; Ser. No. 61/836,380, filed Jun. 18, 2013; Ser. No. 61/833,080, filed Jun. 10, 2013; Ser. No. 61/830,375, filed Jun. 3, 2013; and/or Ser. No. 61/830,377, filed Jun. 3, 2013; which are all hereby incorporated herein by reference in their entireties. The system may communicate with other communication systems via any suitable means, such as by utilizing aspects of the systems described in International Publication Nos. WO/2010/144900; WO 2013/043661 and/or WO 2013/081985, and/or U.S. patent application Ser. No. 13/202,005, filed Aug. 17, 2011, now U.S. Pat. No. 9,126,525, which are hereby incorporated herein by reference in their entireties.

The imaging device and control and image processor and any associated illumination source, if applicable, may comprise any suitable components, and may utilize aspects of the cameras and vision systems described in U.S. Pat. Nos. 5,550,677; 5,877,897; 6,498,620; 5,670,935; 5,796,094; 6,396,397; 6,806,452; 6,690,268; 7,005,974; 7,937,667; 7,123,168; 7,004,606; 6,946,978; 7,038,577; 6,353,392; 6,320,176; 6,313,454 and/or 6,824,281, and/or International Publication Nos. WO 2010/099416; WO 2011/028686 and/or WO 2013/016409, and/or U.S. Pat. Publication No. US 2010-0020170, and/or U.S. patent application Ser. No. 13/534,657, filed Jun. 27, 2012 and published Jan. 3, 2013 as U.S. Publication No. US-2013-0002873, which are all hereby incorporated herein by reference in their entireties. The camera or cameras may comprise any suitable cameras or imaging sensors or camera modules, and may utilize aspects of the cameras or sensors described in U.S. Publication No. US-2009-0244361 and/or U.S. patent application Ser. No. 13/260,400, filed Sep. 26, 2011, now U.S. Pat. Nos. 8,542,451, and/or 7,965,336 and/or 7,480,149, which are hereby incorporated herein by reference in their entireties. The imaging array sensor may comprise any suitable sensor, and may utilize various imaging sensors or imaging array sensors or cameras or the like, such as a CMOS imaging array sensor, a CCD sensor or other sensors or the like, such as the types described in U.S. Pat. Nos. 5,550,677; 5,670, 935; 5,760,962; 5,715,093; 5,877,897; 6,922,292; 6,757, 109; 6,717,610; 6,590,719; 6,201,642; 6,498,620; 5,796, 094; 6,097,023; 6,320,176; 6,559,435; 6,831,261; 6,806, 452; 6,396,397; 6,822,563; 6,946,978; 7,339,149; 7,038, 577; 7,004,606; 7,720,580 and/or 7,965,336, and/or International Publication Nos. WO/2009/036176 and/or WO/2009/046268, which are all hereby incorporated herein by reference in their entireties.

The camera module and circuit chip or board and imaging sensor may be implemented and operated in connection with various vehicular vision-based systems, and/or may be operable utilizing the principles of such other vehicular systems, such as a vehicle headlamp control system, such as the type disclosed in U.S. Pat. Nos. 5,796,094; 6,097,023; 6,320,176; 6,559,435; 6,831,261; 7,004,606; 7,339,149and/or 7,526, 103,which are all hereby incorporated herein by reference in their entireties, a rain sensor, such as the types disclosed in commonly assigned U.S. Pat. Nos. 6,353,392; 6,313,454; 6,320,176 and/or 7,480,149, which are hereby incorporated herein by reference in their entireties, a vehicle vision system, such as a forwardly, sidewardly or rearwardly directed vehicle vision system utilizing principles disclosed in U.S. Pat. Nos. 5,550,677; 5,670,935; 5,760,962; 5,877, 897; 5,949,331; 6,222,447; 6,302,545; 6,396,397; 6,498, 620; 6,523,964; 6,611,202; 6,201,642; 6,690,268; 6,717, 610; 6,757,109; 6,802,617; 6,806,452; 6,822,563; 6,891, 563; 6,946,978 and/or 7,859,565, which are all hereby incorporated herein by reference in their entireties, a trailer hitching aid or tow check system, such as the type disclosed in U.S. Pat. No. 7,005,974, which is hereby incorporated herein by reference in its entirety, a reverse or sideward imaging system, such as for a lane change assistance system or lane departure warning system or for a blind spot or object detection system, such as imaging or detection systems of the types disclosed in U.S. Pat. Nos. 7,881,496; 7,720,580; 7,038,577; 5,929,786 and/or 5,786,772, and/or U.S. provisional applications, Ser. No. 60/628,709, filed Nov. 17, 2004; Ser. No. 60/614,644, filed Sep. 30, 2004; Ser. No. 60/618,686, filed Oct. 14, 2004; Ser. No. 60/638,687, filed Dec. 23, 2004, which are hereby incorporated herein by reference in their entireties, a video device for internal cabin surveillance and/or video telephone function, such as disclosed in U.S. Pat. Nos. 5,760,962; 5,877,897; 6,690,268 and/or 7,370,983, and/or U.S. Publication No. US-2006-0050018, which are hereby incorporated herein by reference in their entireties, a traffic sign recognition system, a system for determining a distance to a leading or trailing vehicle or object, such as a system utilizing the principles disclosed in U.S. Pat. Nos. 6,396,397 and/or 7,123,168, which are hereby incorporated herein by reference in their entireties, and/or the like.

Optionally, the circuit board or chip may include circuitry for the imaging array sensor and or other electronic accessories or features, such as by utilizing compass-on-a-chip or EC driver-on-a-chip technology and aspects such as described in U.S. Pat. Nos. 7,255,451 and/or 7,480,149; and/or U.S. Publication No. US-2006-0061008 and/or U.S. patent application Ser. No. 12/578,732, filed Oct. 14, 2009, now U.S. Pat. No. 9,487,144, which are hereby incorporated herein by reference in their entireties.

Optionally, the vision system may include a display for displaying images captured by one or more of the imaging sensors for viewing by the driver of the vehicle while the driver is normally operating the vehicle. Optionally, for example, the vision system may include a video display device disposed at or in the interior rearview mirror assembly of the vehicle, such as by utilizing aspects of the video mirror display systems described in U.S. Pat. No. 6,690,268 and/or U.S. patent application Ser. No. 13/333,337, filed Dec. 21, 2011, now U.S. Pat. No. 9,487,144, which are hereby incorporated herein by reference in their entireties. The video mirror display may comprise any suitable devices and systems and optionally may utilize aspects of the compass display systems described in U.S. Pat. Nos. 7,370,983; 7,329,013; 7,308,341; 7,289,037; 7,249,860; 7,004,593; 4,546,551; 5,699,044; 4,953,305; 5,576,687; 5,632,092; 5,677,851; 5,708,410; 5,737,226; 5,802,727; 5,878,370; 6,087,953; 6,173,508; 6,222,460; 6,513,252 and/or 6,642,851, and/or European patent application, published Oct. 11, 2000 under Publication No. EP 0 1043566, and/or U.S. Publication No. US-2006-0061008, which are all hereby incorporated herein by reference in their entireties. Optionally, the video mirror display screen or device may be operable to display images captured by a rearward viewing camera of the vehicle during a reversing maneuver of the vehicle (such as responsive to the vehicle gear actuator being placed in a reverse gear position or the like) to assist the driver in backing up the vehicle, and optionally may be operable to display the compass heading or directional heading character or icon when the vehicle is not undertaking a reversing maneuver, such as when the vehicle is being driven in a forward direction along a road (such as by utilizing aspects of the display system described in International Publication No. WO 2012/051500, which is hereby incorporated herein by reference in its entirety).

Optionally, the vision system (utilizing the forward facing camera and a rearward facing camera and other cameras disposed at the vehicle with exterior fields of view) may be part of or may provide a display of a top-down view or birds-eye view system of the vehicle or a surround view at the vehicle, such as by utilizing aspects of the vision systems described in International Publication Nos. WO 2010/099416; WO 2011/028686; WO 2012/075250; WO 2013/019795; WO 2012/075250; WO 2012/145822; WO 2013/081985; WO 2013/086249 and/or WO 2013/109869, and/or U.S. patent application Ser. No. 13/333,337, filed Dec. 21, 2011, now U.S. Pat. No. 9,264,672, which are hereby incorporated herein by reference in their entireties.

Optionally, a video mirror display may be disposed rearward of and behind the reflective element assembly and may comprise a display such as the types disclosed in U.S. Pat. Nos. 5,530,240; 6,329,925; 7,855,755; 7,626,749; 7,581,859; 7,446,650; 7,370,983; 7,338,177; 7,274,501; 7,255,451; 7,195,381; 7,184,190; 5,668,663; 5,724,187 and/or 6,690,268, and/or in U.S. Publication Nos. US-2006-0061008 and/or US-2006-0050018, which are all hereby incorporated herein by reference in their entireties. The display is viewable through the reflective element when the display is activated to display information. The display element may be any type of display element, such as a vacuum fluorescent (VF) display element, a light emitting diode (LED) display element, such as an organic light emitting diode (OLED) or an inorganic light emitting diode, an electroluminescent (EL) display element, a liquid crystal display (LCD) element, a video screen display element or backlit thin film transistor (TFT) display element or the like, and may be operable to display various information (as discrete characters, icons or the like, or in a multi-pixel manner) to the driver of the vehicle, such as passenger side inflatable restraint (PSIR) information, tire pressure status, and/or the like. The mirror assembly and/or display may utilize aspects described in U.S. Pat. Nos. 7,184,190; 7,255,451; 7,446,924 and/or 7,338,177, which are all hereby incorporated herein by reference in their entireties. The thicknesses and materials of the coatings on the substrates of the reflective element may be selected to provide a desired color or tint to the mirror reflective element, such as a blue colored reflector, such as is known in the art and such as described in U.S. Pat. Nos. 5,910,854; 6,420,036 and/or 7,274,501, which are hereby incorporated herein by reference in their entireties.

Optionally, the display or displays and any associated user inputs may be associated with various accessories or systems, such as, for example, a tire pressure monitoring system or a passenger air bag status or a garage door opening system or a telematics system or any other accessory or system of the mirror assembly or of the vehicle or of an accessory module or console of the vehicle, such as an accessory module or console of the types described in U.S. Pat. Nos. 7,289,037; 6,877,888; 6,824,281; 6,690,268; 6,672,744; 6,386,742 and 6,124,886, and/or U.S. Publication No. US-2006-0050018, which are hereby incorporated herein by reference in their entireties.

Changes and modifications in the specifically described embodiments can be carried out without departing from the principles of the invention, which is intended to be limited only by the scope of the appended claims, as interpreted according to the principles of patent law including the doctrine of equivalents.

The invention claimed is:

1. A method for assembling a camera suitable for use for a vision system of a vehicle, the method comprising:
   providing a circuit board having first and second sides separated by a thickness dimension of the circuit board, wherein an imager is disposed at the first side of the circuit board, and wherein solder pads are disposed at the second side of the circuit board and in electrical connection with circuitry of the circuit board;
   aligning a coaxial connector at the solder pads at the second side of the circuit board, wherein the step of aligning the coaxial connector at the solder pads comprises tilting and shifting of the coaxial connector relative to the solder pads via a robot that adjusts the coaxial connector relative to a base coordinate system of the circuit board; and
   soldering the coaxial connector at the second side of the circuit board via the solder pads.

2. The method of claim 1, comprising, before the step of soldering the coaxial connector at the second side of the circuit board, determining when the coaxial connector is aligned with the solder pads at the second side of the circuit board, wherein the step of soldering the coaxial connector at the second side of the circuit board is responsive to determination that the coaxial connector is aligned with the solder pads.

3. The method of claim 2, wherein the step of determining when the coaxial connector is aligned with the solder pads comprises determining when the coaxial connector is aligned with the solder pads via a contactless measuring system.

4. The method of claim 1, wherein the solder pads have a height dimension at the circuit board of at least 1 mm.

5. The method of claim 1, wherein soldering the coaxial connector at the second side of the circuit board via the solder pads comprises at least one of (i) heating the solder pads via a laser, (ii) heating the solder pads via application of heated air, (iii) heating the coaxial connector itself, (iv) conductive heating of the solder pads and (v) inductive heating of the solder pads.

6. The method of claim 1, wherein each solder pad has solder paste disposed thereat, and wherein soldering the coaxial connector at the second side of the circuit board comprises melting the solder paste at the solder pads.

7. The method of claim 6, wherein the solder pads comprise a plurality of outer solder pads and at least one inner solder pad for connecting to respective contact portions of the coaxial connector.

8. The method of claim 6, wherein the solder pads comprise four outer solder pads disposed around one inner solder pad.

\* \* \* \* \*

UNITED STATES PATENT AND TRADEMARK OFFICE
CERTIFICATE OF CORRECTION

| | |
|---|---|
| PATENT NO. | : 11,304,306 B2 |
| APPLICATION NO. | : 16/779818 |
| DATED | : April 12, 2022 |
| INVENTOR(S) | : Jens Steigerwald |

It is certified that error appears in the above-identified patent and that said Letters Patent is hereby corrected as shown below:

In the Specification

<u>Column 1</u>
Line 7, "application is divisional" should be --application is a divisional--

<u>Column 10</u>
Line 28, "7,339,149and/or" should be --7,339,149 and/or--

Signed and Sealed this
Twenty-fourth Day of May, 2022

Katherine Kelly Vidal
*Director of the United States Patent and Trademark Office*